United States Patent [19]
Kunitomo

[11] Patent Number: 5,235,289
[45] Date of Patent: Aug. 10, 1993

[54] TRANSMISSION POWER AMPLIFIER DEVICE

[75] Inventor: Kouichi Kunitomo, Yokohama, Japan

[73] Assignee: Matsushita Electric Industrial Co., Ltd., Osaka, Japan

[21] Appl. No.: 920,905

[22] Filed: Jul. 28, 1992

[30] Foreign Application Priority Data

Aug. 7, 1991 [JP] Japan .................................. 3-221235

[51] Int. Cl.[5] .............................................. H03F 3/193
[52] U.S. Cl. ..................................... 330/277; 330/298; 455/89; 455/127
[58] Field of Search ................ 330/129, 277, 278, 296; 455/89, 116, 127

[56] References Cited

U.S. PATENT DOCUMENTS 5,029,298 7/1991 Chiba et al. ...................... 330/277 X

FOREIGN PATENT DOCUMENTS 2-182007 7/1990 Japan .

Primary Examiner—James B. Mullins
Attorney, Agent, or Firm—Stevens, Davis, Miller & Mosher

[57] ABSTRACT

Disclosed is a transmission power amplifier device comprising a GaAs power amplifier using a GaAs FET as its amplifier element. In order to compensate the non-linearity of the frequency characteristic of the transmission power amplification efficiency of the GaAs power amplifier with respect to individual amplified signal transmission channels, gate voltage information for each of the channels is stored beforehand in a memory, and a gate voltage obtained by adding a fixed voltage to an analog voltage generated on the basis of the gate voltage information read out from the memory is applied to the gate of the GaAs FET so as to flatten the frequency characteristic of the transmission power amplification efficiency.

5 Claims, 4 Drawing Sheets

F I G. 1
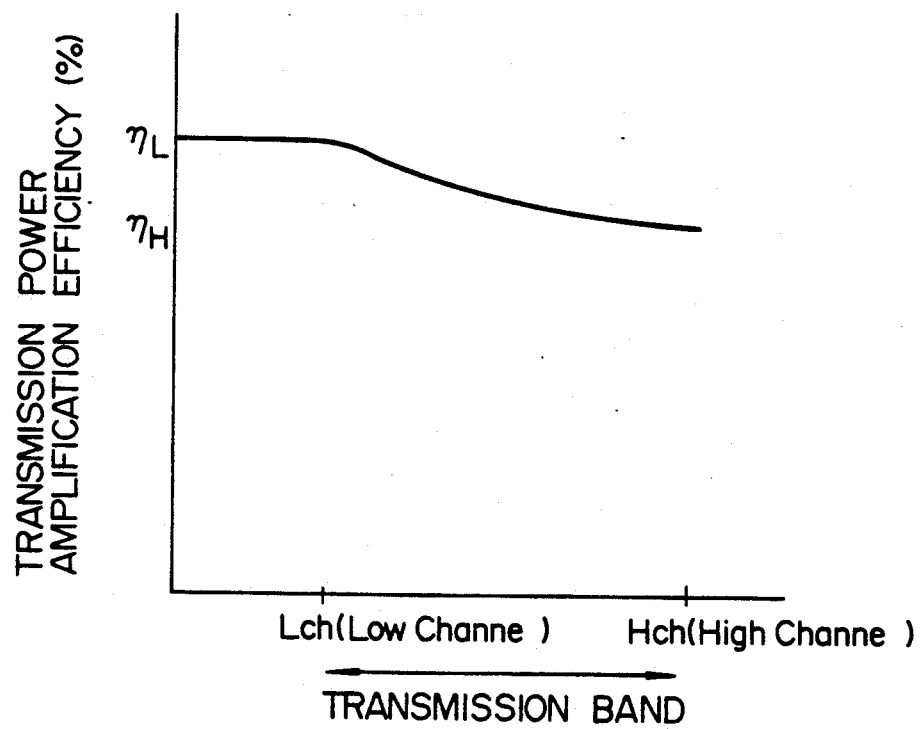

TRANSMISSION POWER AMPLIFIER DEVICE

BACKGROUND OF THE INVENTION

This invention relates to a device for amplifying transmission power in a radio telephone system of small size, such as, a land mobile radio telephone system or a portable radio telephone system.

With the recent research and development for the radio telephone system of the kind described above, the telephone set of the land mobile radio telephone system or of the portable radio telephone system is being more and more reduced in size and weight. Points of great importance to be considered to attain the desired reduction in the size and weight of the telephone set in such a telephone system are how to reduce the size of its transmission power amplifier part and how to improve the efficiency of transmission power amplification. For this purpose, it is the recent tendency to employ a GaAs power amplifier in which a GaAs FET is used as an amplifier element. In this GaAs power amplifier, an output signal transmission line is connected to the output circuit of the GaAs FET, and a predetermined gate voltage is applied to the gate of the GaAs FET so as to amplify an input signal applied to the GaAs FET. In this case, the gate voltage applied to the gate of the GaAs FET is a minus voltage maintained constant regardless of the value of the frequency of the signal to be amplified.

Therefore, the power amplification characteristic peculiar to the GaAs power amplifier is not modified at all, and its power amplification-frequency characteristic appears directly as the transmission power amplification efficiency $\eta$ of the GaAs power amplifier. FIG. 1 shows the above frequency characteristic peculiar to the GaAs power amplifier, and, in FIG. 1, the horizontal axis represents the frequency of the transmission band, and the vertical axis represents the efficiency $\eta$ of transmission power amplification. It will be seen in FIG. 1 that the relation between the transmission power amplification efficiency $\eta$ and the frequency of the transmission band is not constant, and the transmission power amplification efficiency $\eta$ changes or decreases with the increase in the frequency of the transmission band.

SUMMARY OF THE INVENTION

It is an object of the present invention to provide a transmission power amplifier device which solves the prior art problem of instability of the frequency characteristic relative to the transmission power and ensures that the transmission power amplification efficiency is flattened over a wide frequency band.

In the transmission power amplifier device according to the present invention, the relation between the gate voltage of a GaAs FET forming its power amplifier and the corresponding transmission power amplification efficiency is determined beforehand for each of individual transmission channels, a DC voltage is generated on the basis of gate voltage information supplied for optimizing the transmission power amplification efficiency for a selected transmission channel, and a voltage generated from a fixed voltage generator is added to this DC voltage to obtain the optimum gate voltage to be applied to the gate of the GaAs FET.

It is preferable that the device further includes a memory for storing the above relation between the gate voltage and the transmission power amplification efficiency for all the transmission channels and a CPU for controlling reading the gate voltage information from the memory.

BRIEF DESCRIPTION OF THE DRAWINGS

FIG. 1 is a graph showing the frequency characteristic of the transmission power amplification efficiency in a prior art GaAs power amplifier device.

DESCRIPTION OF THE PREFERRED EMBODIMENTS

Preferred embodiments of the present invention will now be described by reference to the drawings.

Figure 2:
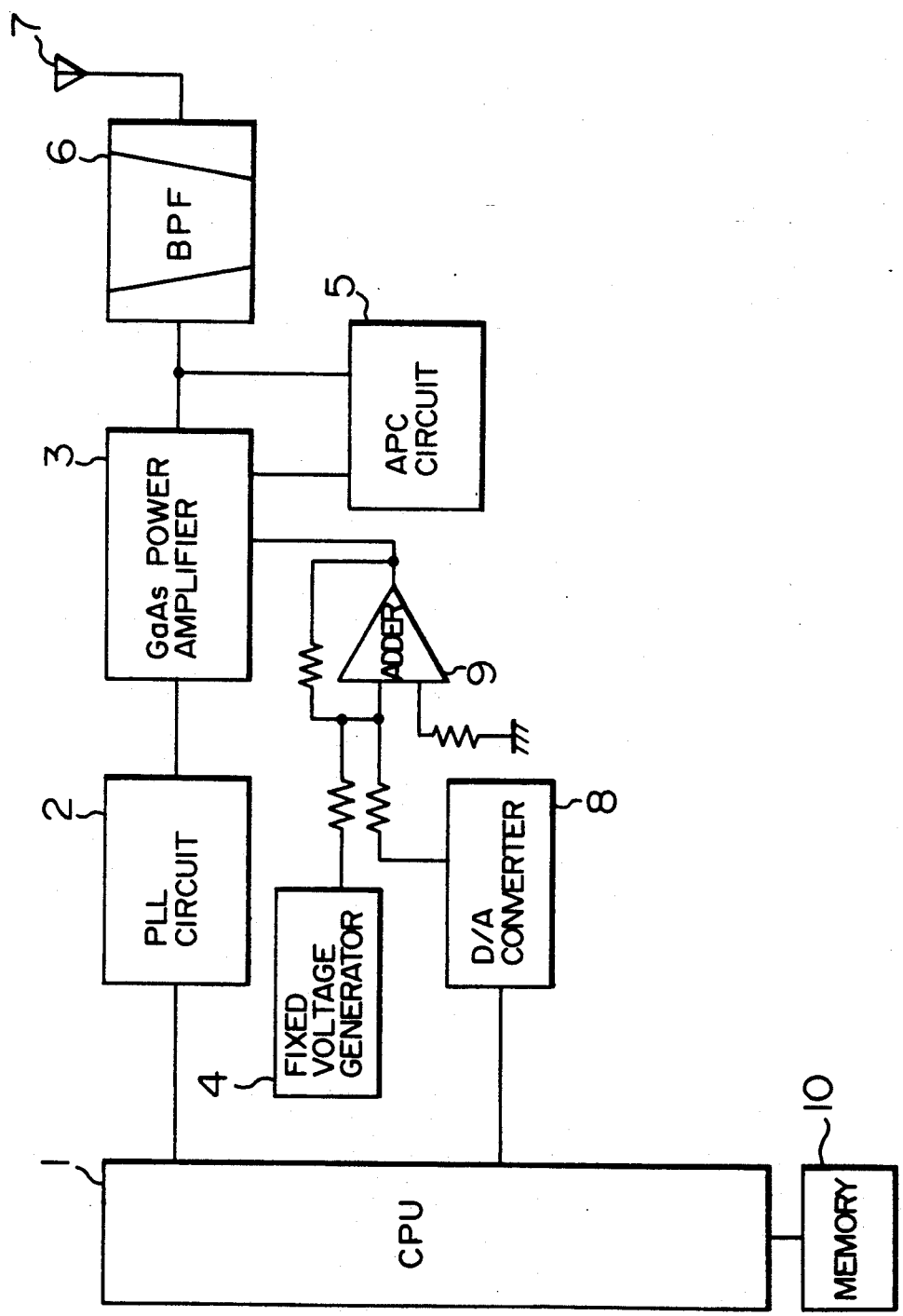
FIG. 2 is a block diagram showing the structure of an embodiment of the transmission power amplifier device according to the present invention.

FIG. 2 is a block diagram showing the structure of an embodiment of the transmission power amplifier device according to the present invention. Referring to FIG. 2, the device comprises a CPU 1 for controlling the operation of the entire device, a PLL (phase locked loop) circuit 2, a GaAs power amplifier 3 using a GaAs FET as its amplifier element, a fixed volta generator 4 generating a minus voltage to be supplied to the gate of the GaAs FET 3, an APC (automatic power control) circuit 5 for automatically controlling the transmission power, a BPF (band-pass filter) 6, an antenna 7, a D/A converter 8, an adder 9, and a memory 10.

Figure 3:
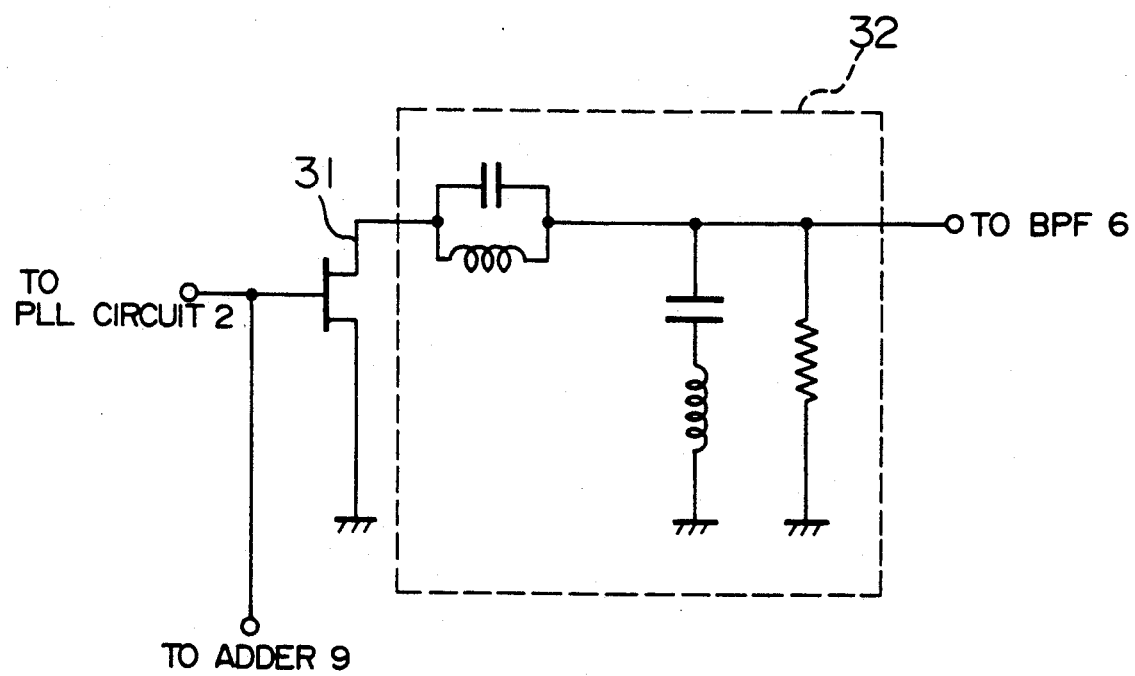
FIG. 3 shows one form of the practical circuit structure of the GaAs power amplifier shown in FIG. 2.

FIG. 3 shows the circuit structure of one form of the GaAs power amplifier 3. Referring to FIG. 3, the GaAs power amplifier 3 include a GaAs FET 31 connected at its gate to both the PLL circuit 2 and the adder 9, and an output circuit 32. In FIG. 3, the impedance value when the output circuit 32 is viewed from the side of the GaAs FET 31 is selected to be zero with respect to even-numbered higher harmonics but selected to be infinitely great with respect to odd-numbered higher harmonics, so that this power amplifier 3 can operate as a class F amplifier with a high efficiency.

The operation of the transmission power amplifier device according to the present invention will now be described by reference to FIGS. 2 and 3. In the device constructed as shown in FIG. 2, the PLL circuit 2 first receives control data from the CPU 1 and generates a signal having the frequency corresponding to the control data. The frequency signal generated from the PLL circuit 2 is applied to the gate of the GaAs FET 31 forming the GaAs power amplifier 3, and its power is amplified. The degree of this power amplification is dependent on the level of the gate voltage applied to the gate of the GaAs FET 31. In FIG. 2, the D/A converter 8 acting as a DC voltage generator receives gate voltage information from the CPU 1 to generate a D/A converted analog DC voltage, and the output voltage of the fixed voltage generator 4 is added in the adder 9 to the DC voltage generated from the D/A converter 8. This sum voltage provides the gate voltage applied to the gate of the GaAs FET 31. In this case, the gate voltage information supplied from the CPU 1 to the D/A converter 8 is determined while taking into consideration the frequency characteristic shown in the graph of FIG. 1 where the gate voltage of the GaAs power amplifier 3 is constant. That is, when the gate voltage of the GaAs power amplifier 3 is set at the constant voltage generated from the fixed voltage generator 4, the efficiency η of transmission power amplification varies depending on the transmission frequency as shown in FIG. 1. Therefore, the sum of the analog output voltage of the D/A converter 8 and the output voltage of the fixed voltage generator 4 is applied to the gate of the GaAs FET 31 forming the GaAs power amplifier 3, so that the output characteristic of the GaAs power amplifier 3 can be maintained constant over the entire frequency band as shown in FIG. 4B.

Figure 4A:
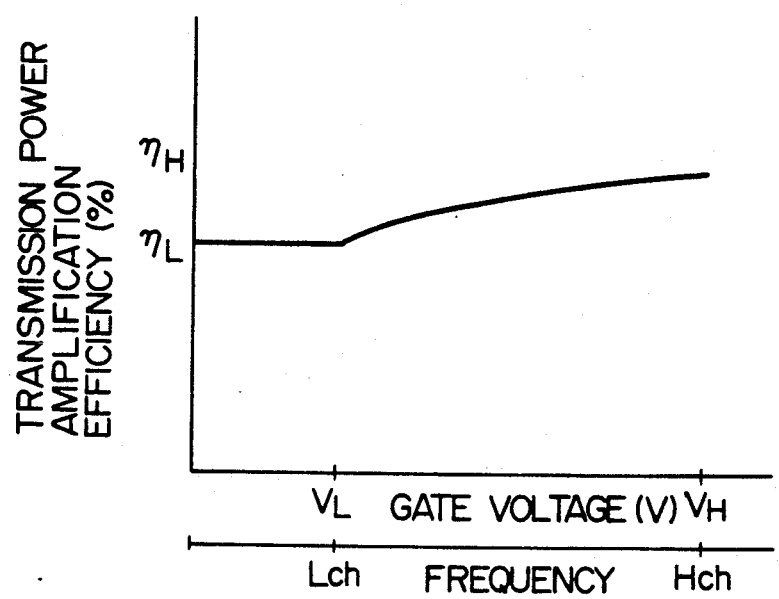
FIG. 4A is a graph showing the relation between the transmission power amplification efficiency and the gate voltage in the GaAs power amplifier shown in FIG. 3.
Figure 4B:
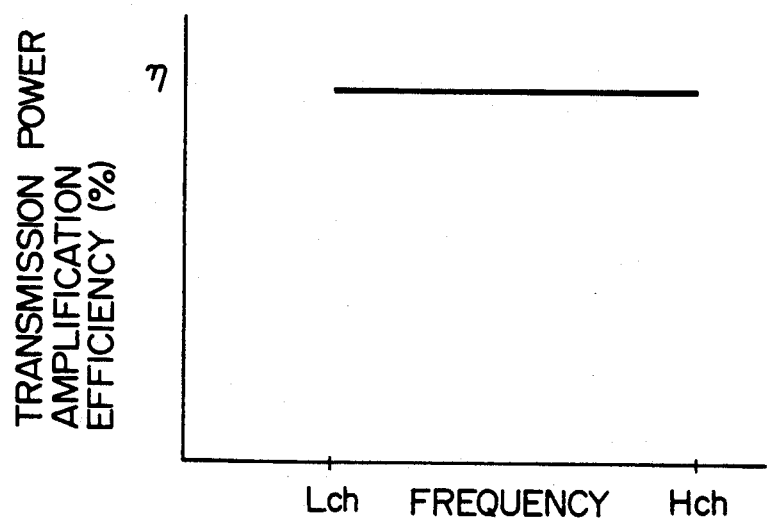
FIG. 4B is a graph showing the resultant improved frequency characteristic of the transmission power amplification efficiency in the transmission power amplifier device having the structure shown in FIG. 2.

For this purpose, the gate voltage information supplied from the CPU 1 is controlled according to the frequency of the signal generated from the PLL circuit 2, so as to change the gate voltage, that is, the analog output voltage generated from the D/A converter 8, as shown in FIG. 4A. As a result, the output characteristic, as shown in FIG. 1, based on the output voltage of the fixed voltage generator 4 and that, as shown in FIG. 4A, based on the output voltage of the D/A converter 8 are added, so that the combined output characteristic of the GaAs power amplifier 3, as shown in FIG. 4B, can be finally obtained.

Thus, the output signal of the PLL circuit 2 is amplified by the GaAs power amplifier 3 with a substantially constant power amplification efficiency over the entire frequency band. After the power of the output signal of the GaAs power amplifier 3 is automatically controlled by the APC (automatic power control) circuit 5, the signal is passed through the BPF (band-pass filter) 6 to be finally transmitted from the antenna 7.

The gate voltage information corresponding to the individual frequencies are stored beforehand in the memory 10 to be read out under control of the CPU 1, so that, on the basis of the frequency of the output signal of the PLL circuit 2, the predetermined gate voltage information can be read out from the memory 10 under control of the CPU 1. For example, the memory 10 may be a look-up table.

According to the illustrated embodiment of the present invention, the gate voltage information that optimizes the power transmission efficiency for a specific transmission frequency is outputted from the memory 10 under control of the CPU 1, and the sum of the DC voltage generated according to the selected gate voltage information and the fixed voltage connected to the gate of the GaAs FET 31 is arranged to change in a relation corresponding to the specific transmission frequency. Therefore, the gate voltage optimizing the transmission power amplification efficiency over the entire frequency band can be applied to the gate of the GaAs FET 31, so that the frequency characteristic of the amplified output signal of the GaAs power amplifier 3 can be satisfactorily flattened.

The GaAs power amplifier 3 referred to in the illustrated embodiment is of the class F amplification type. It is apparent, however, that this power amplifier 3 may be of the class C amplification type commonly employed in this field.

Further, although the memory 10 externally mounted on the CPU 1 is referred to by way of example, it is apparent that this memory 10 may be a register or like internal built-in part of the CPU 1.

It will be understood from the foregoing description of the transmission power amplifier device of the present invention that, in its power amplifier using a GaAs FET element, gate voltage information optimum for each of individual frequencies is stored beforehand in a memory, and the gate voltage of the power amplifier is controlled according to a specific frequency, so that the transmission power can be amplified while maintaining constant the frequency characteristic. Therefore, the transmission power amplifier device according to the present invention can be effectively used in a radio telephone system of small size.

What is claimed is:

1. A transmission power amplifier device comprising:
   a power amplifier including a GaAs FET;
   means for storing the relation between predetermined information of the gate voltage of said GaAs FET and the transmission power amplification efficiency for each of individual channels;
   means for reading out from said storage means the predetermined gate voltage information corresponding to each of said channels;
   means for generating a DC voltage on the basis of the gate voltage information read out from said storage means;
   means for generating a fixed voltage; and
   means for adding said fixed voltage to said DC voltage and applying the sum voltage to the gate of said GaAs FET.

2. A transmission power amplifier device according to claim 1, wherein said means for reading out said gate voltage information from said storage means is a CPU, and said storage means is an externally mounted memory.

3. A transmission power amplifier device according to claim 2, wherein said memory is a look-up table.

4. A transmission power amplifier device according to claim 2, wherein said storage means is built in said CPU.

5. A transmission power amplifier device according to claim 1, wherein said DC voltage generating means is a D/A converter which converts the gate voltage information read out from said storage means into an analog voltage.

* * * * *